(12) United States Patent
Han et al.

(10) Patent No.: US 11,043,549 B2
(45) Date of Patent: Jun. 22, 2021

(54) FLEXIBLE DISPLAY DEVICE AND METHOD OF MANUFACTURING THE SAME

(71) Applicants: Samsung Display Co., Ltd., Yongin-Si (KR); KOREA ADVANCED INSTITUTE OF SCIENCE AND TECHNOLOGY, Daejeon (KR)

(72) Inventors: Sangyoun Han, Seoul (KR); Kyungseop Kim, Hwaseong-si (KR); Jungyong Lee, Daejeon (KR); Kiwon Seo, Daejeon (KR)

(73) Assignee: Samsung Display Co., Ltd.

( * ) Notice: Subject to any disclaimer, the term of this patent is extended or adjusted under 35 U.S.C. 154(b) by 38 days.

(21) Appl. No.: 16/680,132

(22) Filed: Nov. 11, 2019

(65) Prior Publication Data

US 2020/0083313 A1 Mar. 12, 2020

Related U.S. Application Data

(62) Division of application No. 15/979,747, filed on May 15, 2018, now Pat. No. 10,504,987.

(30) Foreign Application Priority Data

May 16, 2017 (KR) ........................ 10-2017-0060264

(51) Int. Cl.
*H01L 23/48* (2006.01)
*H01L 23/52* (2006.01)
(Continued)

(52) U.S. Cl.
CPC ...... *H01L 27/3276* (2013.01); *H01L 27/1218* (2013.01); *H01L 27/1244* (2013.01);
(Continued)

(58) Field of Classification Search
CPC ....... H01L 2227/323; H01L 2251/5338; H01L 27/1218; H01L 27/124; H01L 27/1244;
(Continued)

(56) References Cited

U.S. PATENT DOCUMENTS

| 8,272,726 | B2 | 9/2012 | Hyakudome et al. |
| 9,079,349 | B2 | 7/2015 | Slafer |
| 9,195,108 | B2 | 11/2015 | Park et al. |
| 9,647,052 | B2 | 5/2017 | Youn et al. |

(Continued)

FOREIGN PATENT DOCUMENTS

| KR | 2012-0078875 A | 7/2012 |
| KR | 10-1542942 B1 | 8/2015 |

(Continued)

OTHER PUBLICATIONS

Chen, Chun-Hung and Lee, Yung-Chun; "Fabrication of arrayed metallic nano-particles on a flexible substrate for inducing localized surface plasmon resonance"; Department of Mechanical Engineering, National Cheng Kung University, Feb. 1, 2013; vol. 21, No. 3; 14 pages.

*Primary Examiner* — Theresa T Doan
(74) *Attorney, Agent, or Firm* — Innovation Counsel LLP

(57) ABSTRACT

A flexible display device includes: a flexible substrate; a photo-curable adhesive layer disposed on the flexible substrate; and a metal wiring disposed on the photo-curable adhesive layer. The metal wiring defines a plurality of holes. The flexible display device and a method of manufacturing the flexible display device may substantially prevent detachment of the metal wiring formed on the flexible substrate.

10 Claims, 13 Drawing Sheets

(51) Int. Cl.
*H01L 27/32* (2006.01)
*H01L 51/00* (2006.01)
*H01L 27/12* (2006.01)
*H01L 51/56* (2006.01)

(52) U.S. Cl.
CPC ........ *H01L 51/0097* (2013.01); *H01L 27/124* (2013.01); *H01L 27/1262* (2013.01); *H01L 51/56* (2013.01); *H01L 2227/323* (2013.01); *H01L 2251/5338* (2013.01)

(58) Field of Classification Search
CPC ............. H01L 27/1262; H01L 27/3276; H01L 51/0097; H01L 51/56; Y02E 10/549
USPC ........................................................ 257/776
See application file for complete search history.

(56) References Cited

U.S. PATENT DOCUMENTS

| | | | |
|---|---|---|---|
| 2009/0033215 | A1* | 2/2009 | Horikiri .............. H01L 27/3223 313/504 |
| 2013/0119387 | A1* | 5/2013 | Park ........................ H01L 27/32 257/59 |
| 2015/0101919 | A1 | 4/2015 | Bae et al. |
| 2015/0173200 | A1 | 6/2015 | Kim et al. |
| 2017/0077403 | A1 | 3/2017 | Lee et al. |
| 2017/0115786 | A1 | 4/2017 | Kimura et al. |

FOREIGN PATENT DOCUMENTS

| | | |
|---|---|---|
| KR | 2015-0113471 | 10/2015 |
| KR | 2016-0021930 A | 2/2016 |
| KR | 2016-0059531 | 5/2016 |

* cited by examiner

FLEXIBLE DISPLAY DEVICE AND METHOD OF MANUFACTURING THE SAME

CROSS-REFERENCE TO RELATED APPLICATION

This application is a divisional application of U.S. patent application Ser. No. 15/979,747 filed May 15, 2018, which claims priority under 35 U.S.C. § 119 to Korean Patent Application No. 10-2017-0060264, filed on May 16, 2017, in the Korean Intellectual Property Office (KIPO), the disclosures of which are incorporated by reference herein in their entirety.

TECHNICAL FIELD

Embodiments of the present disclosure relate to a flexible display device and to a method of manufacturing the flexible display device.

DISCUSSION OF RELATED ART

Display devices display images using light emitting elements. In recent times, flat panel display ("FPD") devices have been widely used as display devices. The FPD display devices may be classified into liquid crystal display ("LCD") devices, organic light emitting diode ("OLED") display devices, plasma display panel ("PDP") devices, electrophoretic display devices, and the like based on a light emitting scheme thereof.

Flexible display panels that can be bent have been developed recently. Such a flexible display panel may be used in various fields because it may be used in a folded or curved form. Since organic light emitting elements may be manufactured in a stack structure of a thin film type, they have excellent flexibility and are thus attracting attention as display elements of the flexible display panel.

However, when a stress is concentrated on a metal thin film formed on a flexible substrate, cracks may be generated and a metal thin film may be detached off from the flexible substrate.

It is to be understood that this background is intended to provide useful background for understanding the subject matter of the present disclosure, and as such disclosed herein, the background may include ideas, concepts, or recognitions that are not a part of what is known or appreciated by those skilled in the pertinent art prior to a corresponding effective filing date of the present disclosure.

SUMMARY

Embodiments of the present disclosure may be directed to a flexible display device and a method of manufacturing the flexible display device that may substantially prevent detachment of a metal thin film formed on a flexible substrate.

According to an exemplary embodiment, a flexible display device includes: a flexible substrate; a photo-curable adhesive layer disposed on the flexible substrate; and a metal wiring disposed on the photo-curable adhesive layer. The metal wiring defines a plurality of holes.

Each of the plurality of holes may have an area in a range from about 0.1 $\mu m^2$ to about 0.2 $\mu m^2$ on a plane.

Each of the plurality of holes may have at least one of a circular shape and a polygonal shape.

The plurality of holes may include a first hole, a second hole, and a third hole that are adjacent to each other, and a first imaginary straight line passing through a center of the first hole and a center of the second hole and a second imaginary straight line passing through the center of the first hole and a center of the third hole may substantially form a right angle.

The plurality of holes may include a first hole, a second hole, and a third hole that are adjacent to each other, and a first imaginary straight line passing through a center of the first hole and a center of the second hole and a second imaginary straight line passing through the center of the first hole and a center of the third hole may substantially form 60 degrees.

The holes may be spaced apart from each other at a substantially equal spatial interval.

The holes may be spaced apart from each other by a spatial interval of about 300 nm or more.

The metal wiring may be in the form of a matrix.

The metal wiring may include at least one of aluminum (Al), silver (Ag), copper (Cu), gold (Au), platinum (Pt), iron (Fe), nickel (Ni), and/or titanium (Ti).

According to an exemplary embodiment, a method of manufacturing a flexible display device includes: depositing a metal thin film on a mold substrate defined with a plurality of grooves; forming a photo-curable adhesive layer on a flexible substrate; transferring the metal thin film on the photo-curable adhesive layer to form a metal wiring that defines a plurality of holes corresponding to the plurality of grooves; and curing the photo-curable adhesive layer.

Each of the plurality of grooves and the plurality of holes may have an area in a range from about 0.1 $\mu m^2$ to about 0.2 $\mu m^2$ on a plane.

Each of the plurality of grooves and the plurality of holes may have at least one of a circular shape and a polygonal shape on a plane.

The plurality of holes may include a first hole, a second hole, and a third hole that are adjacent to each other, and a first imaginary straight line passing through a center of the first hole and a center of the second hole and a second imaginary straight line passing through the center of the first hole and a center of the third hole may substantially form a right angle.

The plurality of holes may include a first hole, a second hole, and a third hole that are adjacent to each other, and a first imaginary straight line passing through a center of the first hole and a center of the second hole and a second imaginary straight line passing through the center of the first hole and a center of the third hole may substantially form 60 degrees.

The grooves and the holes may be spaced apart from each other at a substantially equal spatial interval.

The grooves and the holes may be spaced apart from each other by a spatial interval of about 300 nm or more.

The metal wiring may be in the form of a matrix.

The method may further include pre-curing the photo-curable adhesive layer before transferring the metal thin film on the photo-curable adhesive layer to form the metal wiring that defines the plurality of holes.

The metal wiring may include at least one of Al, Ag, Cu, Au, Pt, Fe, Ni, and/or Ti.

The foregoing is illustrative only, and is not intended to be in any way limiting. In addition to the illustrative aspects, exemplary embodiments, and features described above, further aspects, exemplary embodiments, and features will become apparent to those of ordinary skill in the art by reference to the drawings, and the following detailed description.

BRIEF DESCRIPTION OF THE DRAWINGS

A more complete appreciation of the present disclosure will become more apparent by describing in detail exemplary embodiments thereof with reference to the accompanying drawings, wherein.

DETAILED DESCRIPTION

Figure 1:
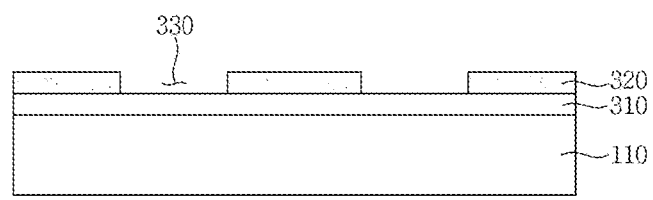
FIG. 1 is a cross-sectional view illustrating a flexible display device according to an exemplary embodiment.

Exemplary embodiments will now be described more fully hereinafter with reference to the accompanying drawings. Although the present disclosure may be modified in various manners and have several exemplary embodiments, the exemplary embodiments are illustrated in the accompanying drawings and will be mainly described in the present disclosure. However, the scope of the present disclosure is not limited to the exemplary embodiments and should be construed as including changes, equivalents, and substitutions without deviating from the spirit and scope of the present disclosure.

In the drawings, thicknesses of layers and areas are illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper," and the like, may be used herein for ease of description to describe the spatial relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device located "below" or "beneath" another device may be placed "above" or "on" another device. Accordingly, the illustrative term "below" or "beneath" may include both the lower and upper positions. The device may also be oriented in the other direction, and the spatially relative terms may be interpreted differently depending on the orientations.

Throughout the present disclosure, when an element is referred to as being "connected" to another element, the element is "directly connected" to the other element, or "electrically connected" to the other element with one or more intervening elements interposed therebetween. It will be further understood that the terms "comprises," "including," "includes," and/or "including," when used in the present disclosure, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for a particular value or a range or values as determined by one of ordinary skill in the art, considering the measurement in question and the error associated with measurement of the particular value(s) (i.e., the limitations of the measurement system). For example, "about" may mean within one or more standard deviations, or within ±30%, 20%, 10%, 5% of the stated value(s).

Unless otherwise defined, terms used herein (including technical and scientific terms) have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present disclosure.

Some of the parts that are not associated with the description may not be provided to specifically describe embodiments of the present disclosure, and like reference numerals refer to like elements throughout the present disclosure.

Hereinafter, an exemplary embodiment will be described in detail with reference to FIGS. 1 to 9.

FIG. 1 is a cross-sectional view illustrating a flexible display device according to an exemplary embodiment.

Referring to FIG. 1, a flexible display device includes a flexible substrate 110, a photo-curable adhesive layer 310, and a metal wiring 320.

The flexible substrate 110 may include a flexible material. The flexible material may include a plastic material. For example, the flexible substrate 110 may include one selected from a group consisting of: kapton, polyethersulphone (PES), polycarbonate (PC), polyimide (PI), polyethyleneterephthalate (PET), polyethylene naphthalate (PEN), polyacrylate (PAR), fiber reinforced plastic (FRP), and/or the like.

The flexible substrate 110 may have a thickness in a range from about 5 μm to about 200 μm. When the flexible substrate 110 has a thickness less than about 5 μm, it is difficult for the flexible substrate 110 to stably support an organic light emitting element thereon. On the other hand, when the flexible substrate 110 has a thickness of about 200 μm or more, the flexible characteristics of the flexible substrate 110 may be degraded.

The photo-curable adhesive layer 310 is disposed on the flexible substrate 110. For example, the photo-curable adhesive layer 310 is disposed between the flexible substrate 110 and the metal wiring 320 to be described below.

The photo-curable adhesive layer 310 may be a resin such as a photo-curable resin including a monomer, an oligomer, and a small amount of photo-initiator. When the photo-initiator included in the resin is irradiated to light, e.g., ultraviolet (UV) light, photopolymerization reaction is initiated such that the monomer and the oligomer may instantaneously form a polymer to be cured.

The metal wiring 320 is disposed on the photo-curable adhesive layer 310. For example, the metal wiring 320 directly contacts the photo-curable adhesive layer 310 when disposed on the photo-curable adhesive layer 310.

The metal wiring 320 may define a plurality of holes 330. The plurality of holes 330 will be described in detail below with reference to FIGS. 2A, 2B, 2C, 3A, 3B, and 3C.

The metal wiring 320 may include at least one of aluminum (Al), silver (Ag), copper (Cu), gold (Au), platinum (Pt), iron (Fe), nickel (Ni), and titanium (Ti).

Figure 2A:
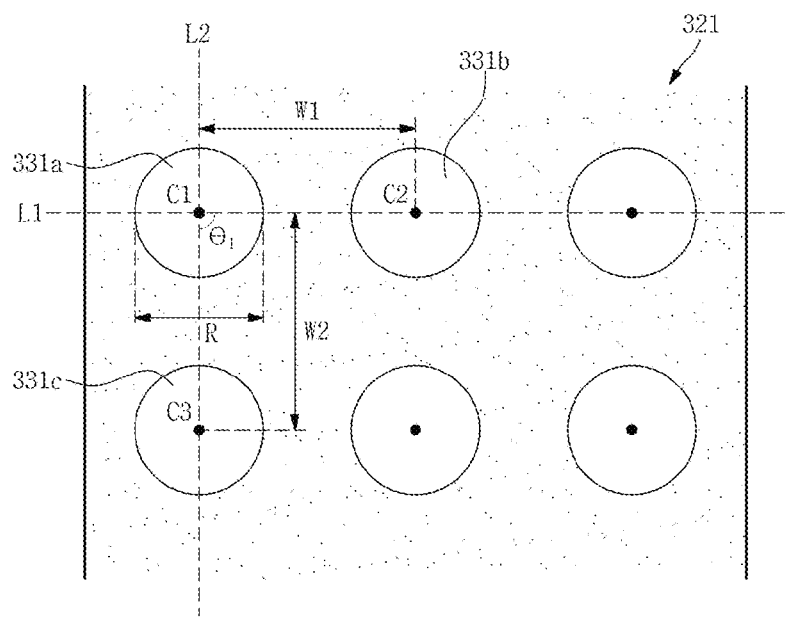
FIGS. 2A, 2B, and 2C are plan views illustrating metal wirings according to first, second, and third exemplary embodiments.
Figure 2B:
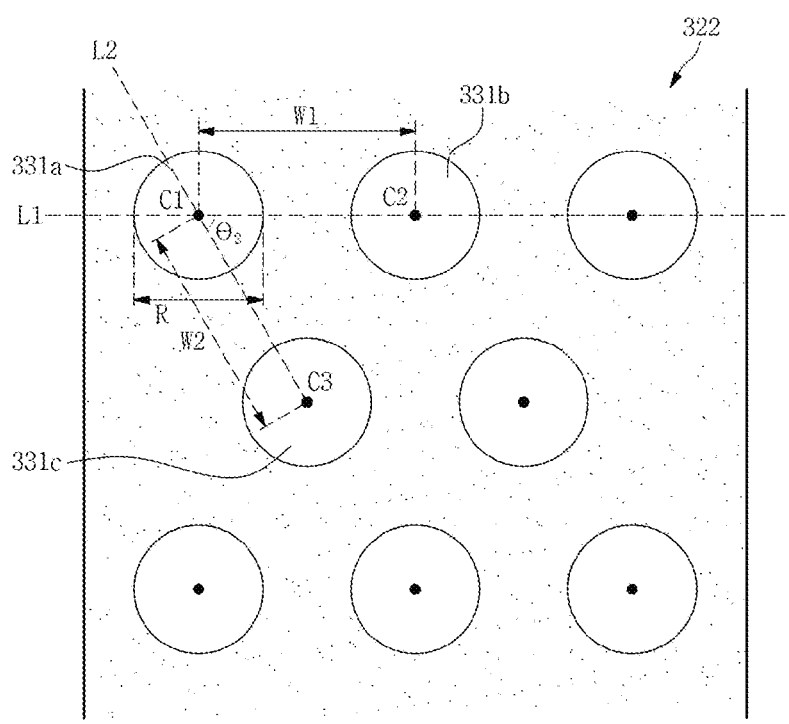
Figure 2C:
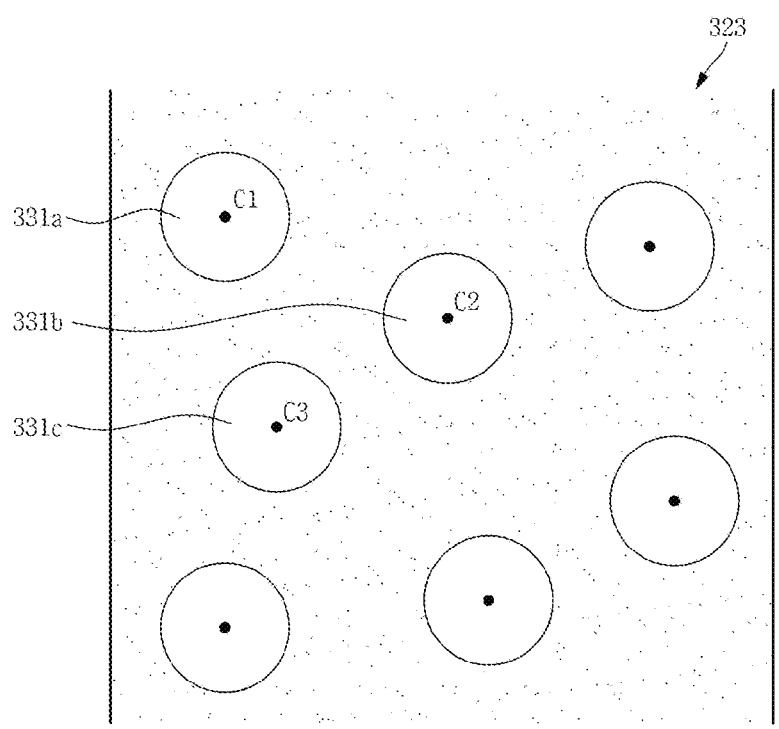

FIGS. 2A, 2B, and 2C are plan views illustrating metal wirings according to first, second, and third exemplary embodiments.

Referring to FIGS. 2A, 2B, and 2C, metal wirings 321, 322, and 323 define a plurality of holes 331a, 331b, and 331c. Each of the plurality of holes 331a, 331b, and 331c may have a circular shape on a plane. Accordingly, the metal wirings according to an exemplary embodiment may improve mechanical durability regardless of a direction of an applied stress, thereby substantially preventing detachment of the metal wirings from the flexible substrate 110.

Each of the plurality of holes 331a, 331b, and 331c may have a diameter R of about 200 nm or more and about 500 nm or less on the plane. Accordingly, each of the plurality of holes 331a, 331b, and 331c may have an area in a range from about 0.1 μm² to about 0.2 μm² on the plane.

Referring to FIG. 2A, the plurality of holes 331a, 331b, and 331c include a first hole 331a, a second hole 331b, and a third hole 331c that are adjacent to each other. For example, when a center of the first hole 331a is defined as a first center C1, a center of the second hole 331b is defined as a second center C2, and a center of the third hole 331c is defined as a third center C3, the first center C1 may be spaced equally from the second center C2 and the third center C3 (W1=W2). In such an exemplary embodiment, the first center C1 may be spaced apart from each of the second center C2 and the third center C3 by a spatial interval of about 300 nm or more and about 700 nm or less.

When an imaginary straight line passing through the first center C1 and the second center C2 is defined as a first straight line L1, and another imaginary straight line passing through the first center C1 and the third center C3 is defined as a second straight line L2, the first straight line L1 and the second straight line L2 may substantially form a first angle (e.g., θ1=90 degree).

Referring to FIG. 2B, the plurality of holes 331a, 331b, and 331c include a first hole 331a, a second hole 331b, and a third hole 331c that are adjacent to each other. The first, second, and third holes 331a, 331b, and 331c may be spaced apart from each other at substantially equal spatial intervals. For example, when a center of the first hole 331a is defined as a first center C1, a center of the second hole 331b is defined as a second center C2, and a center of the third hole 331c is defined as a third center C3, the first center C1 may be spaced equally from the second center C2 and the third center C3 (W1=W2). In such an exemplary embodiment, the first, second, and third holes 331a, 331b, and 331c may be spaced apart from each other by a spatial interval of about 300 nm or more and about 700 nm or less. That is, the first center C1 may be spaced apart from each of the second center C2 and the third center C3 by a spatial interval of about 300 nm or more and about 700 nm or less.

In addition, when an imaginary straight line passing through the first center C1 and the second center C2 is defined as a first straight line L1, and another imaginary straight line passing through the first center C1 and the third center C3 is defined as a second straight line L2, the first straight line L1 and the second straight line L2 may substantially form a second angle (e.g., θ2=60 degree).

Referring to FIG. 2C, the plurality of holes 331a, 331b, and 331c include a first hole 331a, a second hole 331b, and a third hole 331c that are adjacent to each other. The first, second, and third holes 331a, 331b, and 331c may be spaced from each other at different spatial intervals. For example, when a center of the first hole 331a is defined as a first center C1, a center of the second hole 331b is defined as a second center C2, and a center of the third hole 331c is defined as a third center C3, the first center C1 may be spaced apart from the second center C2 and the third center C3 by different spatial intervals. In such an exemplary embodiment, the first, second, and third holes 331a, 331b, and 331c may be spaced apart from each other by different spatial intervals of about 300 nm or more and about 700 nm or less. That is, the first center C1 may be spaced apart from the second center C2 and the third center C3 by different spatial intervals, respectively, of about 300 nm or more and about 700 nm or less.

Figure 3A:
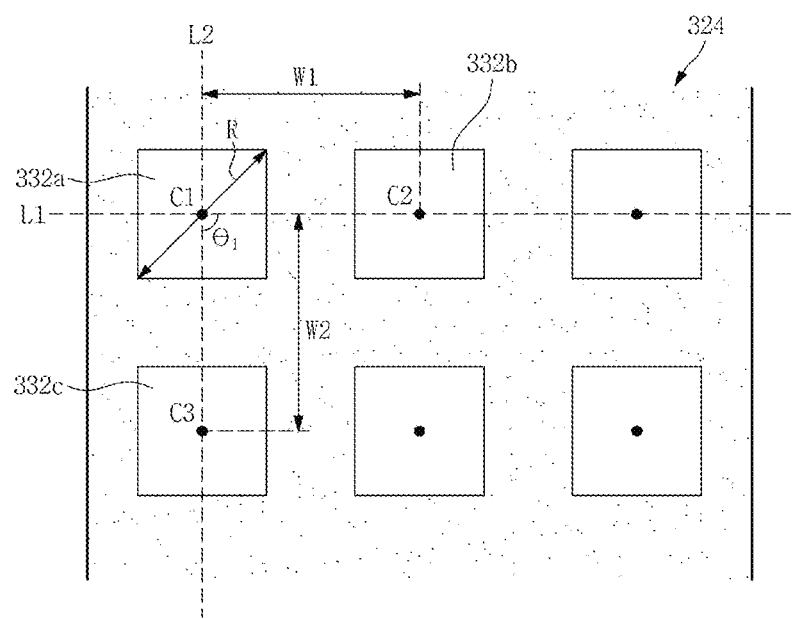
FIGS. 3A, 3B, and 3C are plan views illustrating metal wirings according to fourth, fifth, and sixth exemplary embodiments.
Figure 3B:
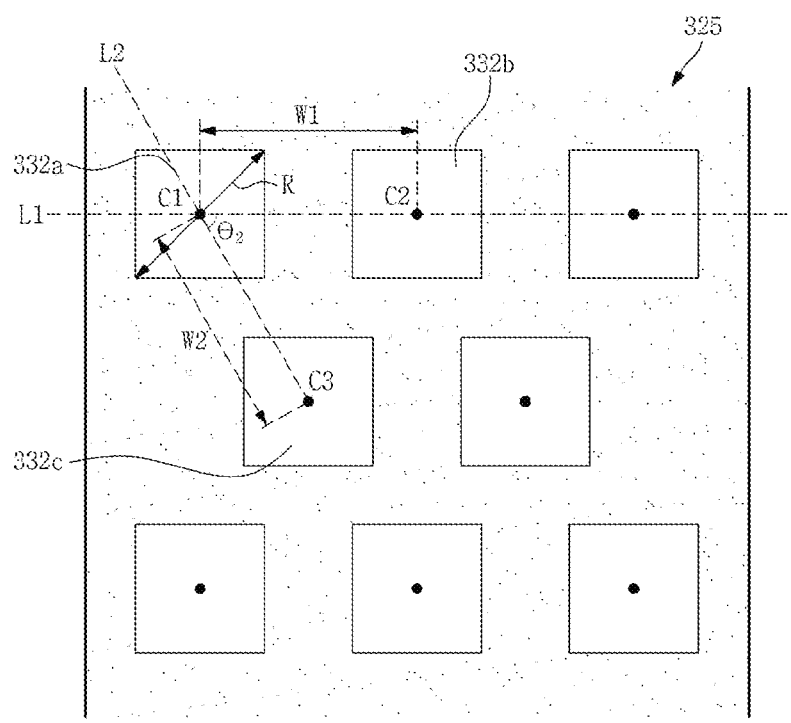
Figure 3C:
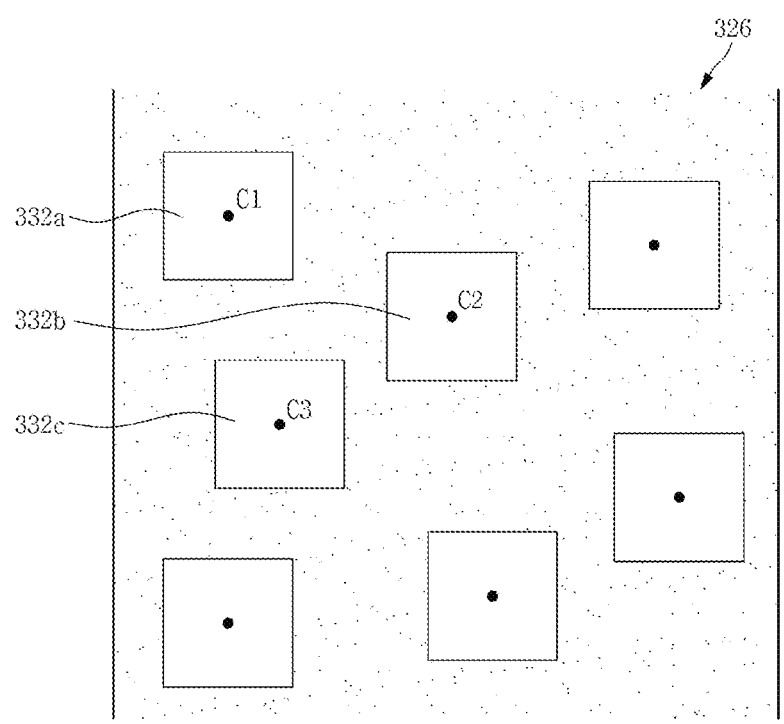

FIGS. 3A, 3B, and 3C are plan views illustrating metal wirings according to fourth, fifth, and sixth exemplary embodiments.

Referring to FIGS. 3A, 3B, and 3C, metal wirings 324, 325, and 326 define a plurality of holes 332a, 332b, and 332c. The plurality of holes 332a, 332b, and 332c may have a quadrangular shape on a plane. However, exemplary embodiments are not limited thereto, and the plurality of holes 332a, 332b, and 332c may have a polygonal shape on a plane. Accordingly, mechanical durability of the metal wirings may be improved in a predetermined direction depending on the shape of the plurality of holes 332a, 332b, and 332c, and the detachment of the metal wiring from the flexible substrate 110 may be substantially prevented.

Each of the plurality of holes 332a, 332b, and 332c may have a diagonal line R of about 200 nm or more and about 500 nm or less on the plane. Accordingly, the plurality of holes 332a, 332b, and 332c may have an area in a range from about 0.1 μm² to about 0.2 μm² on the plane.

Referring to FIG. 3A, the plurality of holes 332a, 332b, and 332c include a first hole 332a, a second hole 332b, and a third hole 332c that are adjacent to each other. The first, second, and third holes 332a, 332b, and 332c may be spaced apart from each other at substantially equal spatial intervals. For example, when a center of the first hole 332a is defined as a first center C1, a center of the second hole 332b is defined as a second center C2, and a center of the third hole 332c is defined as a third center C3, the first center C1 may be spaced equally from the second center C2 and the third center C3 (W1=W2). In such an exemplary embodiment, the first center C1 may be spaced apart from each of the second center C2 and the third center C3 by a spatial interval of about 300 nm or more and about 700 nm or less.

In addition, when an imaginary straight line passing through the first center C1 and the second center C2 is defined as a first straight line L1, and another imaginary straight line passing through the first center C1 and the third center C3 is defined as a second straight line L2, the first straight line L1 and the second straight line L2 may substantially form a first angle (e.g., θ1=90 degree).

Referring to FIG. 3B, the plurality of holes 332a, 332b, and 332c include a first hole 332a, a second hole 332b, and a third hole 332c that are adjacent to each other. The first, second, and third holes 332a, 332b, and 332c may be spaced apart from each other at substantially equal spatial intervals. For example, when a center of the first hole 332a is defined as a first center C1, a center of the second hole 332b is defined as a second center C2, and a center of the third hole 332c is defined as a third center C3, the first center C1 may be spaced equally from the second center C2 and the third center C3 (W1=W2). In such an exemplary embodiment, the first, second, and third holes 332a, 332b, and 332c may be spaced apart from each other by a spatial interval of about 300 nm or more and about 700 nm or less. That is, the first center C1 may be spaced apart from each of the second center C2 and the third center C3 by a spatial interval of about 300 nm or more and about 700 nm or less.

In addition, when an imaginary straight line passing through the first center C1 and the second center C2 is defined as a first straight line L1, and another imaginary straight line passing through the first center C1 and the third center C3 is defined as a second straight line L2, the first straight line L1 and the second straight line L2 may substantially form a second angle (e.g., θ2=60 degree).

Referring to FIG. 3C, the plurality of holes 332a, 332b, and 332c include a first hole 332a, a second hole 332b, and a third hole 332c that are adjacent to each other. The first, second, and third holes 332a, 332b, and 332c may be spaced from each other at different spatial intervals. For example, when a center of the first hole 332a is defined as a first center C1, a center of the second hole 332b is defined as a second center C2, and a center of the third hole 332c is defined as a third center C3, the first center C1 may be spaced apart from each of the second center C2 and the third center C3 by different spatial intervals. In such an exemplary embodiment, the first, second, and third holes 332a, 332b, and 332c may be spaced apart from each other by different spatial intervals of about 300 nm or more. That is, the first center C1 may be spaced apart from the second center C2 and the third center C3 by different spatial intervals, respectively, of about 300 nm or more.

In an exemplary embodiment, the metal wirings 321, 322, 323, 324, 325, and 326 respectively defining the plurality of holes 331a, 331b, 331c or the plurality of holes 332a, 332b, and 332c are connected in the form of a matrix. Accordingly, electric conductivity of the metal wirings 321, 322, 323, 324, 325, and 326 may not be reduced, and the mechanical durability of the metal wirings is improved. Accordingly, detachment of the metal wirings 321, 322, 323, 324, 325, and 326 from the flexible substrate 110 may be substantially prevented.

Figure 4:
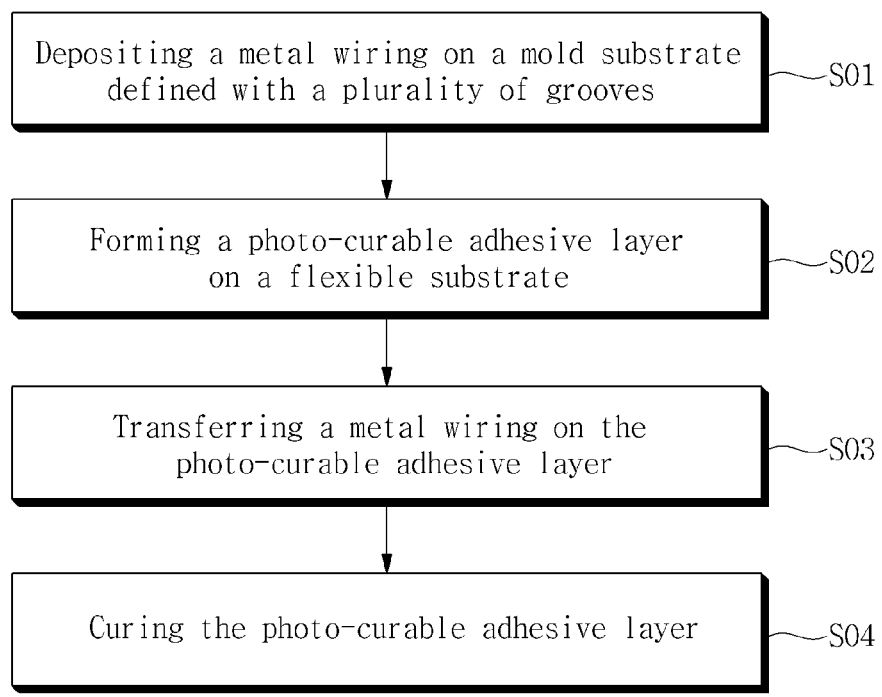
FIG. 4 is a flowchart illustrating a process of manufacturing a flexible display device according to a first exemplary embodiment.

FIG. 4 is a flowchart illustrating a process of manufacturing a flexible display device according to a first exemplary embodiment. FIGS. 5A, 5B, 5C, and 5D are views illustrating a process of manufacturing the flexible display device according to the first exemplary embodiment. FIG. 6A is a plan view illustrating a part A of FIG. 5D, and FIG. 6B is a plan view illustrating a part B of FIG. 5D.

Hereinafter, a process of manufacturing a flexible display device according to the first exemplary embodiment will be described in detail with reference to FIGS. 4, 5A, 5B, 5C, 5D, 6A, and 6B.

Figure 5A:
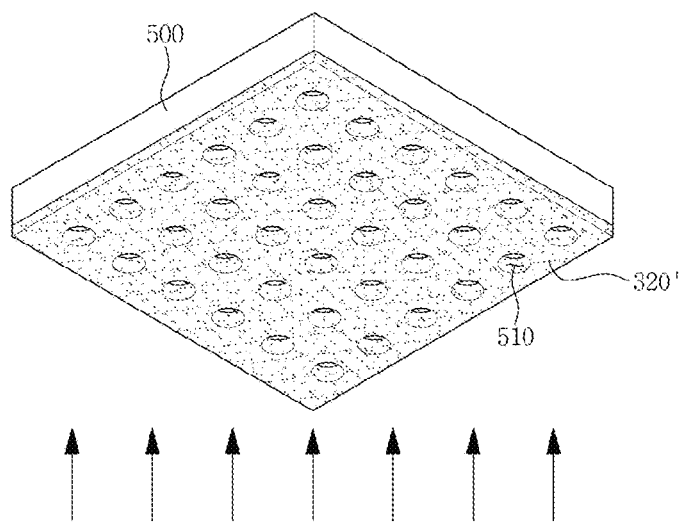
FIGS. 5A, 5B, 5C, and 5D are views illustrating a process of manufacturing the flexible display device according to the first exemplary embodiment.
Figure 6A:
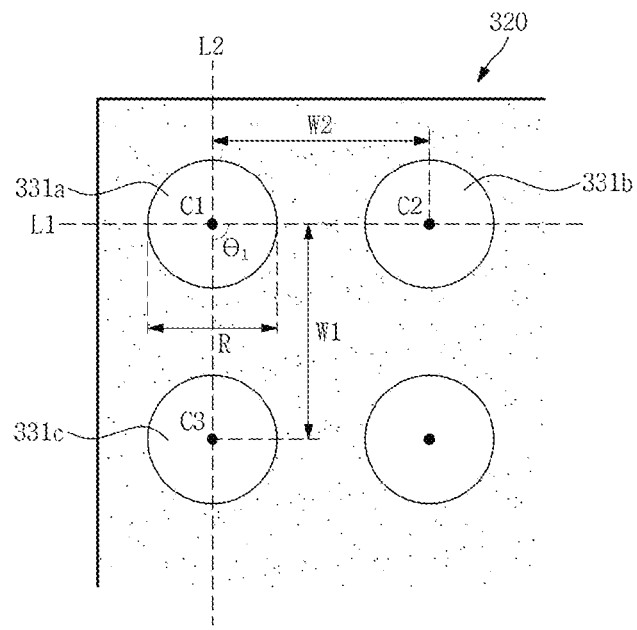
FIG. 6A is a plan view illustrating a part A of FIG. 5D.
Figure 6B:
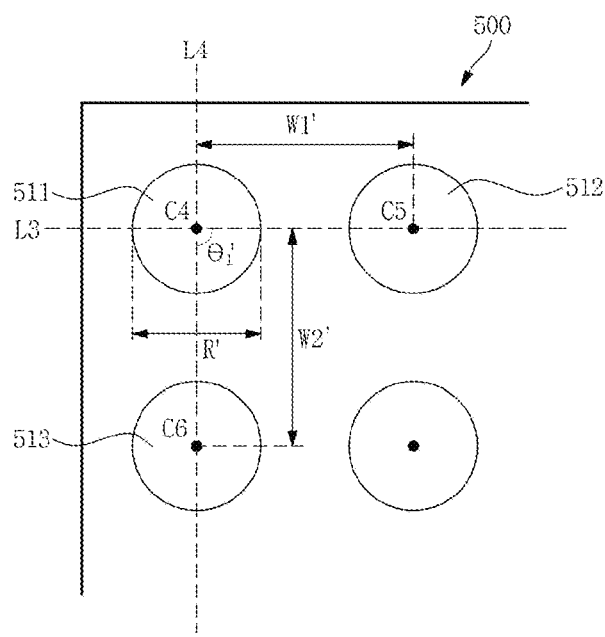
FIG. 6B is a plan view illustrating a part B of FIG. 5D.

First, as illustrated in FIGS. 4 and 5A, a metal thin film 320' is deposited on a mold substrate 500 defined with a plurality of grooves 510 (S01).

The mold substrate 500 may include a polymer having elasticity. For example, the mold substrate 500 may include polydimethylsiloxane (PDMS), polyurethane acrylate (PUA), or the like.

The metal thin film 320' may be deposited on the mold substrate 500 by one of a sputtering method, an E-beam evaporation method, a thermal evaporation method, a laser molecular beam epitaxy (L-MBE) method, and a pulsed and laser deposition (PLD) method.

When the metal thin film 320' is deposited on the mold substrate 500, as the linearity of a metal material forming the metal thin film 320' increases, the metal thin film 320' may be substantially prevented from being deposited on a side surface of the plurality of grooves 510 of the mold substrate 500, such that the plurality of holes 331a, 331b, and 331c of the metal wiring 320 to be described below may be more accurately defined.

Figure 5B:
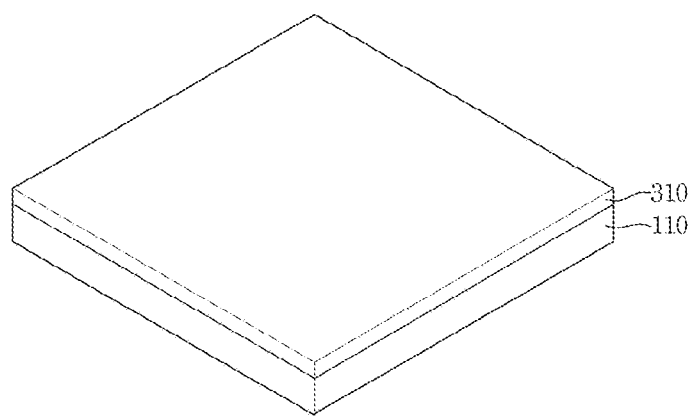
Figure 5C:
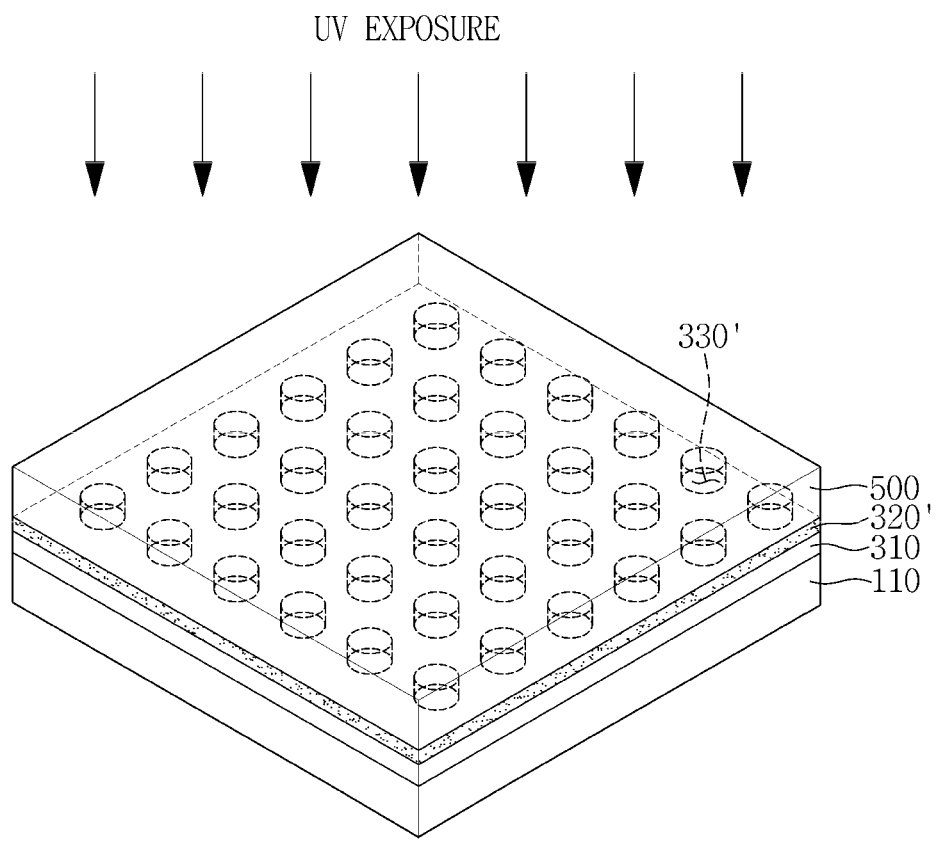
Figure 5D:
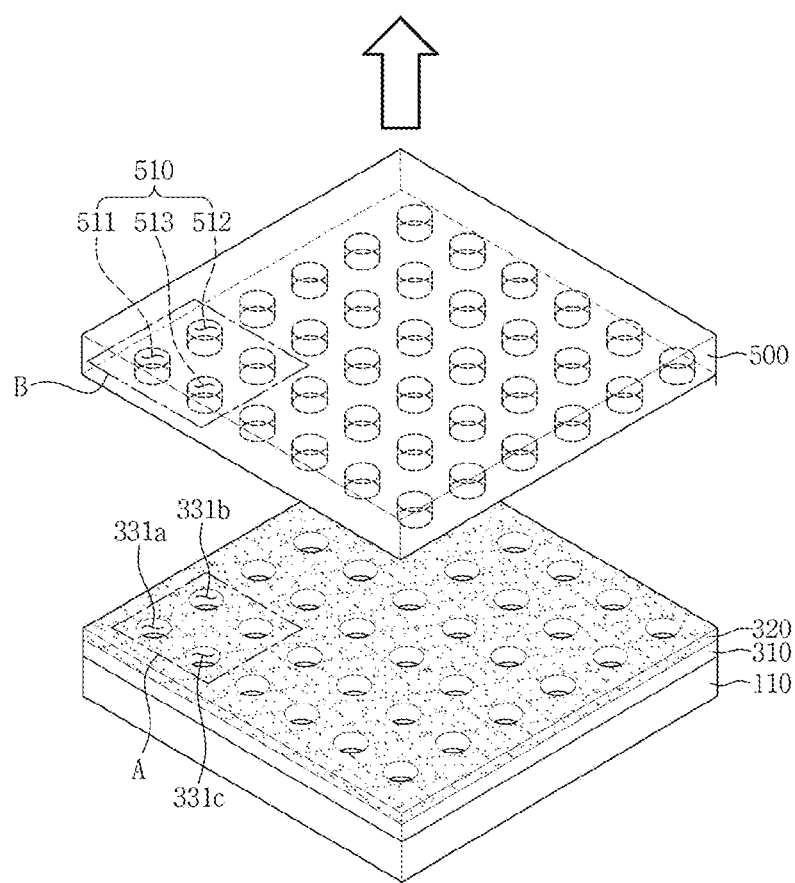

Subsequently, as illustrated in FIG. 5B, the photo-curable adhesive layer 310 is formed on the flexible substrate 110 (S02). For example, the photo-curable adhesive layer 310 may be formed by a spin coating method and may be formed on the flexible substrate 110 to have a uniform thickness.

Although not illustrated, pre-curing of the photo-curable adhesive layer 310 on the flexible substrate 110 may be further performed. For example, to transfer the metal thin film 320' to the photo-curable adhesive layer 310 in a step to be described below, adhesiveness of the photo-curable adhesive layer 310 may be maintained by controlling a pre-curing time.

Next, the metal thin film 320' is transferred onto the photo-curable adhesive layer 310 to form the metal wiring 320 that defines the plurality of holes 331a, 331b, and 331c (S03). For example, the metal thin film 320' is brought into contact with the photo-curable adhesive layer 310, and a pressing force is applied to the mold substrate 500 and the flexible substrate 110 to transfer the metal thin film 320' disposed on the mold substrate 500 to the photo-curable adhesive layer 310. In such an exemplary embodiment, the pressing force applied to the mold substrate 500 and the flexible substrate 110 may be controlled so that the metal thin film 320' deposited inside the plurality of grooves 510 is not transferred to the photo-curable adhesive layer 310.

Finally, the photo-curable adhesive layer 310 is completely cured (S04). Accordingly, the metal thin film 320' is completely transferred to the photo-curable adhesive layer 310.

The mold substrate 500 and the flexible substrate 110 are detached from each other, and the metal wiring 320 formed of the metal thin film 320' is separated from the mold substrate 500, as illustrated in FIG. 5D.

The metal thin film 320' except for a portion deposited inside the plurality of grooves 510 is transferred to the photo-curable adhesive layer 310. That is, the portion of the metal thin film 320' located on the photo-curable adhesive layer 310 corresponding to the plurality of grooves 510 of the mold substrate 500 is not transferred. Accordingly, the plurality of holes 331a, 331b, and 331c are defined at positions corresponding to the plurality of grooves 510 by the metal wiring 320 that is formed of the metal thin film 320'.

As illustrated in FIG. 6A, the plurality of holes 331*a*, 331*b*, and 331*c* may include a first hole 331*a*, a second hole 331*b*, and a third hole 331*c* that are adjacent to each other. The first, second, and third holes 331*a*, 331*b*, and 331*c* may be spaced apart from each other at substantially equal spatial intervals. For example, when a center of the first hole 331*a* is defined as a first center C1, a center of the second hole 331*b* is defined as a second center C2, and a center of the third hole 331*c* is defined as a third center C3, the first center C1 may be spaced equally from the second center C2 and the third center C3 (W1=W2). In such an exemplary embodiment, the first center C1 may be spaced apart from each of the second center C2 and the third center C3 by a spatial interval of about 300 nm or more and about 700 nm or less. In addition, when an imaginary straight line passing through the first center C1 and the second center C2 is defined as a first straight line L1, and another imaginary straight line passing through the first center C1 and the third center C3 is defined as a second straight line L2, the first straight line L1 and the second straight line L2 may substantially form a first angle (e.g., θ1=90 degree). However, exemplary embodiments are not limited thereto, and as in the second exemplary embodiment, the first straight line L1 and the second straight line L2 may substantially form a second angle θ2 that is different from the first angle θ1 (θ2=60 degree).

Each of the plurality of holes 331*a*, 331*b*, and 331*c* may have a diameter R of about 200 nm or more and about 500 nm or less on a plane. Accordingly, each of the plurality of holes 331*a*, 331*b*, and 331*c* may have an area in a range from about 0.1 $\mu m^2$ to about 0.2 $\mu m^2$ on the plane.

The plurality of grooves 510 of the mold substrate 500 may include a first groove 511, a second groove 512, and a third groove 513 that are adjacent to each other. The first, second, and third grooves 511, 512 and 513 may be spaced from each other at substantially equal spatial intervals. For example, when a center of the first groove 511 is defined as a fourth center C4, a center of the second groove 512 is defined as a fifth center C5, and a center of the third groove 513 is defined as a sixth groove C6, the fourth center C4 may be spaced equally from the fifth center C5 and the sixth center C6 (W1'=W2'). In such an exemplary embodiment, the first center C1 may be spaced apart from each of the second center C2 and the third center C3 by a spatial interval of about 300 nm or more and about 700 nm or less. In addition, when an imaginary straight line passing through the fourth center C4 and the fifth center C5 is defined as a third straight line L3, and another imaginary straight line passing through the fourth center C4 and the sixth center C6 is defined as a fourth straight line L4, the third straight line L3 and the fourth straight line L4 may substantially form a first angle (θ1'=90 degree). However, exemplary embodiments are not limited thereto, and as in the second exemplary embodiment, the third straight line L3 and the fourth straight line L4 may substantially form a second angle θ2' that is different from the first angle θ1' (e.g., θ2'=60 degree).

Each of the plurality of grooves 511, 512, and 513 may have a diameter R' of about 200 nm or more and about 500 nm or less on a plane. Accordingly, each of the plurality of grooves 511, 512, and 513 may have an area in a range from about 0.1 $\mu m^2$ to about 0.2 $\mu m^2$ on a plane.

According to the first exemplary embodiment, while the metal thin film 320' is transferred to the photo-curable adhesive layer 310, the plurality of holes 331*a*, 331*b*, and 331*c* overlap the plurality of grooves 511, 512, and 513. For example, as illustrated in FIGS. 6A and 6B, the first, second, and third centers C1, C2, and C3 substantially overlap the fourth, fifth, and sixth centers C4, C5, and C6, respectively, and the first and second straight lines L1 and L2 substantially overlap the third and fourth straight lines L3 and L4, respectively.

The plurality of holes 331*a*, 331*b*, and 331*c* have substantially equal sizes and substantially identical shapes as those of the plurality of grooves 511, 512, and 513, respectively. For example, each of the plurality of holes 331*a*, 331*b*, and 331*c* and the plurality of grooves 511, 512, and 513 may have a circular shape having the substantially equal diameter R. However, exemplary embodiments are not limited thereto, and each of the plurality of holes 331*a*, 331*b*, and 331*c* and the plurality of grooves 511, 512, and 513 may have a polygonal shape having a substantially equal diagonal line.

The first angle θ1 between the first straight line L1 and the second straight line L2 may be substantially equal to the first angle θ1' between the third straight line L3 and the fourth straight line L4.

Figure 7A:
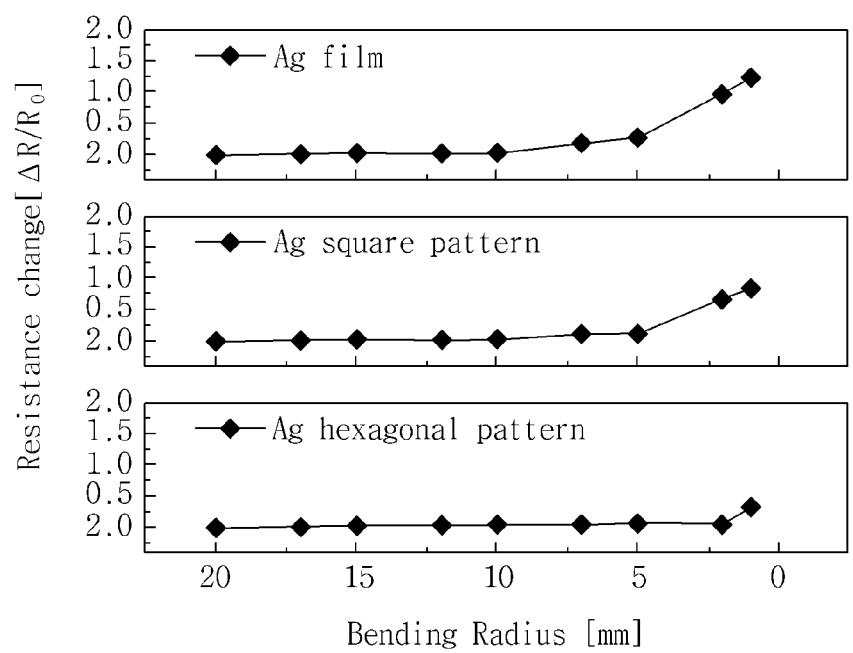
FIGS. 7A and 7B are views illustrating mechanical characteristics of a metal wiring according to an exemplary embodiment.
Figure 7B:
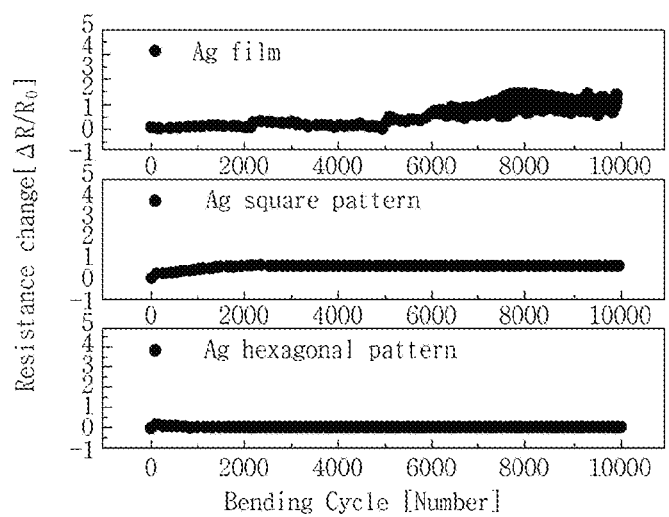

FIGS. 7A and 7B are views illustrating mechanical characteristics of a metal wiring according to an exemplary embodiment.

A relative change in the mechanical durability and electric conductivity of the metal wiring according to an exemplary embodiment will be described in detail with reference to FIGS. 7A and 7B.

FIG. 7A is a graph showing a relative change in electric conductivity of a silver (Ag) film as represented by $\Delta R/R_0$ (here $R_0$ represents a baseline resistance when the bending radius is 20 mm, and $\Delta R$ represents a change of the resistance compared to the baseline resistance $R_0$ as the bending radius changes) depending on a bending radius of a flexible substrate. In the case of a conventional Ag film not defined with holes, it may be appreciated that the relative change of electric conductivity increases as the bending radius decreases. On the other hand, in the case of Ag films according to the first exemplary embodiment having the Ag film with a square hole pattern and the second exemplary embodiment having the Ag film with a hexagonal hole pattern, it may be appreciated that the relative change of electric conductivity is relatively less than that of the conventional Ag film with no holes. In particular, it may be appreciated that the relative change of electric conductivity of the Ag film according to the second exemplary embodiment with a hexagonal hole pattern is smaller than that according to the first exemplary embodiment with a square hole pattern.

FIG. 7B is a graph showing a relative change $\Delta R/R_0$ of electric conductivity of an Ag film depending on a bending cycle of a flexible substrate. In the case of a conventional Ag film not defined with holes, it may be appreciated that the relative change $\Delta R/R_0$ of electric conductivity increases as the bending cycle increases. On the other hand, it may be appreciated that, in the case of the Ag films according to the first exemplary embodiment and the second exemplary embodiment, as compared to the conventional Ag film, the relative change $\Delta R/R_0$ of electric conductivity depending on bending cycle is relatively small, and the relative change $\Delta R/R_0$ of electric conductivity does not greatly increases although the bending cycle increases. In particular, in the case of the Ag film according to the second exemplary embodiment with a hexagonal hole pattern, it may be appreciated that the relative change $\Delta R/R_0$ of electric conductivity depending on bending cycle is smaller than the first exemplary embodiment with a square hole pattern, and substantially no relative change $\Delta R/R_0$ is observed although the bending cycles up to 10000 cycles.

Figure 8:
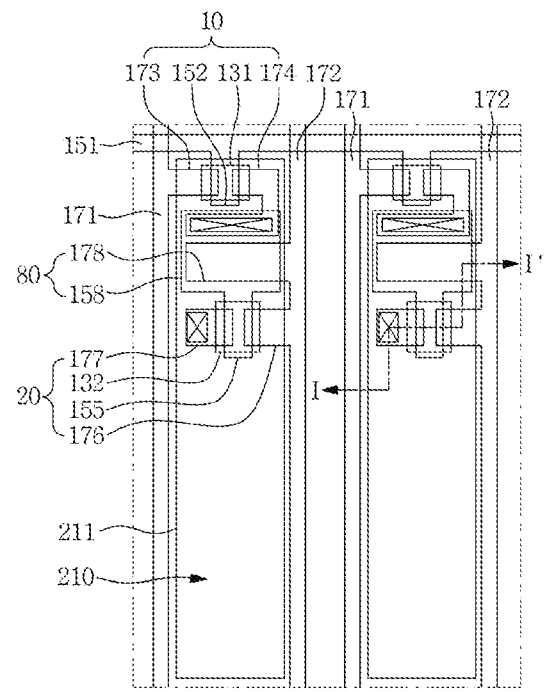
FIG. 8 is a plan view illustrating a flexible display device according to an exemplary embodiment.
Figure 9:
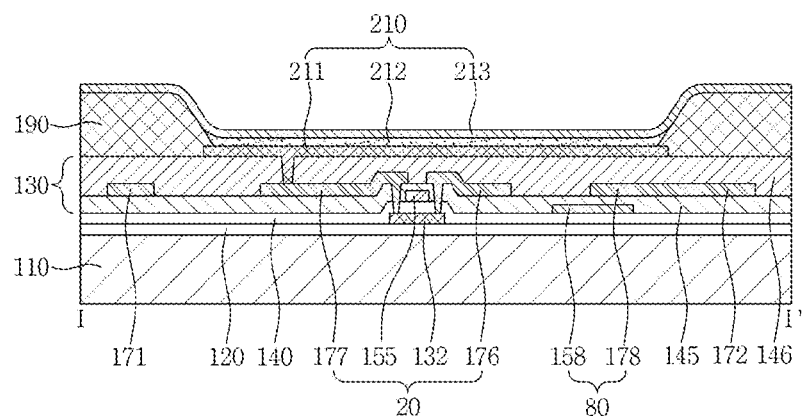
FIG. 9 is a cross-sectional view taken along the line I-I' of FIG. 8.

FIG. 8 is a plan view illustrating a flexible display device according to an exemplary embodiment, and FIG. 9 is a cross-sectional view taken along the line I-I' of FIG. 8.

The flexible display device is assumed to be an organic light emitting diode ("OLED") display device. However, the scope of exemplary embodiments is not limited to the OLED display device. For example, exemplary embodiments may be applied to a liquid crystal display ("LCD") device.

Referring to FIGS. 8 and 9, the flexible display device includes a flexible substrate 110, a wiring portion 130, and an OLED 210.

A buffer layer 120 is disposed on the flexible substrate 110. The buffer layer 120 may include one or more layers selected from various inorganic layers and organic layers. The buffer layer 120 may serve to substantially prevent infiltration of undesirable elements, such as impurities and moisture, into the wiring portion 130 and the OLED 210, and to planarize a surface below the buffer layer 120. However, the buffer layer 120 is not invariably necessary and may be omitted.

The wiring portion 130 is disposed on the buffer layer 120. The wiring portion 130 includes a switching thin film transistor ("TFT") 10, a driving TFT 20, and a capacitor 80 that drives the OLED 210. The OLED 210 emits light according to a driving signal received from the wiring portion 130 to display images.

FIGS. 8 and 9 illustrate an active matrix-type organic light emitting diode (AMOLED) display device having a 2Tr-1Cap structure. For example, the 2Tr-1Cap structure may include two TFTs, e.g., the switching TFT 10 and the driving TFT 20, and one capacitor 80 in each pixel, but exemplary embodiments are not limited thereto. For example, the OLED display device may include three or more TFTs and two or more capacitors in each pixel and may further include additional wirings. Herein, the term "pixel" refers to a unit for displaying an image, and the OLED display device displays images using a plurality of pixels.

Each pixel includes the switching TFT 10, the driving TFT 20, the capacitor 80, and the OLED 210. In addition, a gate line 151 extending along one direction, and a data line 171 and a common power line 172 insulated from and intersecting the gate line 151 are also provided in the wiring portion 130. Each pixel may be defined by the gate line 151, the data line 171, and the common power line 172 as a boundary, but exemplary embodiments are not limited thereto. The pixels may be defined by a pixel defining layer 190.

The capacitor 80 includes a pair of capacitor plates 158 and 178, having an insulating interlayer 145 interposed therebetween. In such an exemplary embodiment, the insulating interlayer 145 may be a dielectric element. A capacitance of the capacitor 80 is determined by electric charges accumulated in the capacitor 80 and a voltage across the pair of capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. A gate insulating layer 140 is further provided to insulate the semiconductor layers 131 and 132 and the gate electrodes 152 and 155.

The switching TFT 10 may function as a switching element that selects a pixel to perform light emission. The switching gate electrode 152 is connected to the gate line 151, and the switching source electrode 173 is connected to the data line 171. Spaced apart from the switching source electrode 173, the switching drain electrode 174 is connected to one of the capacitor plates of the capacitor 80, e.g., the capacitor plate 158.

The driving TFT 20 applies a driving power that allows an organic light emitting layer 212 of an OLED 210 in a selected pixel to emit light to a first electrode 211 that is a pixel electrode PE. The driving gate electrode 155 is connected to said one capacitor plate 158 that is connected to the switching drain electrode 174. Each of the driving source electrode 176 and the other capacitor plate of the capacitor 80, e.g., the capacitor plate 178, is connected to the common power line 172. The driving drain electrode 177 is connected to the first electrode 211 of the OLED 210 through a contact hole.

The switching TFT 10 is driven based on a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted by (or from) the switching TFT 10 is stored in the capacitor 80, and a current corresponding to the voltage stored in the capacitor 80 flows to the OLED 210 through the driving TFT 20 such that the OLED 210 may emit light.

According to an exemplary embodiment, the gate line 151, the data line 171, and the common power line 172 may include the photo-curable adhesive layer 310 and the metal wiring 320 described above. That is, according to an exemplary embodiment, each of the gate line 151, the data line 171, and the common power line 172 may define a plurality of holes, and the gate line 151, the data line 171, and the common power line 172 may be improved in terms of mechanical durability such that detachment of the metal wiring 320, such as the gate line 151, the data line 171, and the common power line 172, may be substantially prevented.

A planarization layer 146 is disposed on the insulating interlayer 145. The planarization layer 146 includes an insulating material and protects the wiring portion 130.

The OLED 210 is disposed on the planarization layer 146. The OLED 210 includes a first electrode 211, an organic light emitting layer 212 disposed on the first electrode 211, and a second electrode 312 disposed on the organic light emitting layer 212. Holes and electrons are injected into the organic light emitting layer 212 from the first electrode 211 and the second electrode 312, respectively, and are combined therein to form an exciton. When the exciton falls from an excited state to a ground state, light emission occurs.

The first electrode 211 is an anode for injecting holes, and the second electrode 213 is a cathode for injecting electrons. However, exemplary embodiments are not limited thereto, and the first electrode 211 may be a cathode, and the second electrode 213 may be an anode.

The first electrode 211 may include a reflective layer, and the second electrode 213 may include a semi-transmissive layer. Accordingly, a light generated in the organic light emitting layer 212 is emitted through the second electrode 213, and thus the structure of a top emission type may be achieved. However, exemplary embodiments are not limited thereto.

The reflective electrode and the semi-transmissive electrode may include one or more metals of magnesium (Mg), silver (Ag), gold (Au), calcium (Ca), lithium (Li), chromium (Cr), copper (Cu), and aluminum (Al), or an alloy thereof. In such an exemplary embodiment, the reflective electrode or the semi-transmissive electrode may be determined according to the thickness. In general, the semi-transmissive electrode may have a thickness of about 200 nm or less.

For example, the first electrode 211 may include a reflective layer including one or more metals of magnesium (Mg), silver (Ag), gold (Au), calcium (Ca), lithium (Li), chromium (Cr), copper (Cu), and aluminum (Al) and a transparent conductive layer disposed on the reflective layer. In such an exemplary embodiment, the transparent conductive layer may include transparent conductive oxide (TCO). Examples of the TCO may include: indium tin oxide (ITO), indium zinc oxide (IZO), zinc oxide (ZnO), aluminum zinc oxide (AZO), and/or indium oxide ($In_2O_3$). Since such a transparent conductive layer including TCO has a high work function, hole injection through the first electrode 211 may become smooth.

In addition, the first electrode 211 may have a triple-layer structure in which a transparent conductive layer, a reflective layer, and a transparent conductive layer are sequentially stacked.

The second electrode 213 may include a semi-transmissive layer including one or more metals selected from the group consisting of magnesium (Mg), silver (Ag), gold (Au), calcium (Ca), lithium (Li), chromium (Cr), copper (Cu), and aluminum (Al).

Although not illustrated, at least one of a hole injection layer HIL and a hole transport layer HTL may further be disposed between the first electrode 211 and the organic light emitting layer 212. In addition, at least one of an electron transport layer ETL and an electron injection layer EIL may further be disposed between the organic light emitting layer 212 and the second electrode 213.

The pixel defining layer 190 has an opening. The opening of the pixel defining layer 190 exposes a portion of the first electrode 211. The first electrode 211, the organic light emitting layer 212, and the second electrode 213 are sequentially stacked at the opening of the pixel defining layer 190. As such, the pixel defining layer 190 may define a light emission area.

In an exemplary embodiment, the second electrode 213 may be disposed on the pixel defining layer 190 as well as on the organic light emitting layer 212.

As set forth hereinabove, according to one or more exemplary embodiments, the flexible display device may provide the following effects.

Metal wirings of a metal thin film disposed on a flexible substrate are connected in the form of a matrix such that detachment of metal wirings may be substantially prevented while electric conductivity is not reduced.

While the present disclosure has been illustrated and described with reference to the exemplary embodiments thereof, it will be apparent to those of ordinary skill in the art that various changes in form, and detail may be formed thereto without departing from the spirit, and scope of the present disclosure.

What is claimed is:

1. A method of manufacturing a flexible display device, the method comprising:
   depositing a metal thin film on a mold substrate defined with a plurality of grooves;
   forming a photo-curable adhesive layer on a flexible substrate;
   transferring the metal thin film on the photo-curable adhesive layer to form a metal wiring that defines a plurality of holes corresponding to the plurality of grooves; and
   curing the photo-curable adhesive layer.

2. The method of claim 1, wherein each of the plurality of grooves and the plurality of holes has an area in a range from about 0.1 $\mu m^2$ to about 0.2 $\mu m^2$ on a plane.

3. The method of claim 1, wherein each of the plurality of grooves and the plurality of holes has at least one of a circular shape and a polygonal shape on a plane.

4. The method of claim 1, wherein the plurality of holes comprises a first hole, a second hole, and a third hole that are adjacent to each other, and
   a first imaginary straight line passing through a center of the first hole and a center of the second hole and a second imaginary straight line passing through the center of the first hole and a center of the third hole substantially form a right angle.

5. The method of claim 1, wherein the plurality of holes comprises a first hole, a second hole, and a third hole that are adjacent to each other, and
   a first imaginary straight line passing through a center of the first hole and a center of the second hole and a second imaginary straight line passing through the center of the first hole and a center of the third hole substantially form 60 degrees.

6. The method of claim 1, wherein the grooves and the holes are spaced apart from each other at a substantially equal spatial interval.

7. The method of claim 1, wherein the grooves and the holes are spaced apart from each other by a spatial interval of about 300 nm or more.

8. The method of claim 1, wherein the metal wiring is in the form of a matrix.

9. The method of claim 1, further comprising pre-curing the photo-curable adhesive layer before transferring the metal thin film on the photo-curable adhesive layer to form the metal wiring that defines the plurality of holes.

10. The method of claim 1, wherein the metal wiring comprises at least one of Al, Ag, Cu, Au, Pt, Fe, Ni, and/or Ti.

* * * * *